US012575303B2

(12) United States Patent
Liu et al.

(10) Patent No.: US 12,575,303 B2
(45) Date of Patent: Mar. 10, 2026

(54) ORGANIC LIGHT-EMITTING DISPLAY PANEL AND MANUFACTURING METHOD THEREFOR, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jinjie Liu, Beijing (CN); Zhongguo Xu, Beijing (CN); Xiaofeng Yang, Beijing (CN); Shuibin Ni, Beijing (CN); Yongmao Wang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 564 days.

(21) Appl. No.: 17/920,044

(22) PCT Filed: Jul. 5, 2021

(86) PCT No.: PCT/CN2021/104490
§ 371 (c)(1),
(2) Date: Oct. 20, 2022

(87) PCT Pub. No.: WO2022/033232
PCT Pub. Date: Feb. 17, 2022

(65) Prior Publication Data
US 2023/0180587 A1 Jun. 8, 2023

(30) Foreign Application Priority Data
Aug. 10, 2020 (CN) .......................... 202010796982.5

(51) Int. Cl.
| | |
|---|---|
| H10K 59/80 | (2023.01) |
| H10K 71/60 | (2023.01) |
| H10K 59/35 | (2023.01) |

(52) U.S. Cl.
CPC ... H10K 59/8792 (2023.02); H10K 59/80521 (2023.02); H10K 71/60 (2023.02); *H10K 59/351* (2023.02)

(58) Field of Classification Search
CPC ......... H10K 59/8792; H10K 59/80521; H10K 71/60; H10K 59/351; H10K 59/352;
(Continued)

(56) References Cited

U.S. PATENT DOCUMENTS

| | | | | |
|---|---|---|---|---|
| 2008/0122347 A1* | 5/2008 | Lee | .................. | H10K 59/80521 |
| | | | | 445/24 |
| 2009/0108743 A1* | 4/2009 | Kobayashi | ......... | H10K 59/8791 |
| | | | | 313/504 |
| 2009/0206733 A1* | 8/2009 | Hwang | ................ | H10K 50/854 |
| | | | | 445/24 |
| 2014/0346449 A1* | 11/2014 | Choi | .................... | H10K 59/877 |
| | | | | 438/23 |

(Continued)

FOREIGN PATENT DOCUMENTS

| | | |
|---|---|---|
| CN | 108878675 A | 11/2018 |
| CN | 110246873 A | 9/2019 |

(Continued)

OTHER PUBLICATIONS

International Search Report for PCT/CN2021/104490 Mailed Oct. 8, 2021.

*Primary Examiner* — Bitew A Dinke
(74) *Attorney, Agent, or Firm* — Ling Wu; Stephen Yang; Ling and Yang Intellectual Property

(57) ABSTRACT

An organic light-emitting display panel and a manufacturing method therefor, and a display device are provided. An organic light-emitting display panel includes: a substrate, organic light-emitting elements and an encapsulation layer, the encapsulation layer and the substrate defining a sealing space, the organic light-emitting elements being provided in (Continued)

the sealing space, each organic light-emitting element including an anode, an organic light-emitting layer and a cathode sequentially stacked in a direction away from the substrate, a first protrusion being provided on the side of each organic light-emitting layer away from the substrate, and a portion of the cathode covering the first bulge forming a second bulge; and a color filter layer provided on the side of the encapsulation layer away from the organic light-emitting elements, the color filter layer comprising color resist blocks and black matrices, the color resist blocks and the organic light-emitting elements being arranged in one-to-one correspondence.

8 Claims, 3 Drawing Sheets

(58) Field of Classification Search
    CPC ...... H10K 59/353; H10K 59/38; H10K 59/10;
                        H10K 50/865; H10K 71/00
    See application file for complete search history.

(56)                References Cited

U.S. PATENT DOCUMENTS

| | | |
|---|---|---|
| 2015/0090991 A1 | 4/2015 | Ishii et al. |
| 2015/0243930 A1 | 8/2015 | Kim et al. |
| 2016/0211311 A1* | 7/2016 | Sato ........................ H10K 59/38 |
| 2017/0162632 A1* | 6/2017 | Kim ...................... H10K 59/351 |
| 2017/0250377 A1* | 8/2017 | Tokuda .............. H10K 59/8792 |
| 2018/0331326 A1 | 11/2018 | Woo et al. |
| 2019/0267439 A1* | 8/2019 | Jang ........................ H10K 59/38 |
| 2021/0167144 A1* | 6/2021 | Lim ...................... H10K 59/875 |
| 2021/0193763 A1 | 6/2021 | Sun et al. |
| 2021/0202594 A1* | 7/2021 | Jo ........................ H10K 59/8792 |
| 2021/0408489 A1* | 12/2021 | Tian ................... H10K 59/8792 |
| 2023/0180587 A1* | 6/2023 | Liu .................... H10K 59/8792 |
| | | 257/40 |

FOREIGN PATENT DOCUMENTS

| | | |
|---|---|---|
| CN | 110581230 A | 12/2019 |
| CN | 111223904 A | 6/2020 |
| CN | 111900263 A | 11/2020 |
| WO | 2020115837 A1 | 6/2020 |

* cited by examiner

420

S100

Forming organic light emitting elements and an encapsulation layer packaging the organic light emitting elements on a substrate

S200

Forming a color film layer on a side of the encapsulation layer away from the organic light emitting elements

ORGANIC LIGHT-EMITTING DISPLAY PANEL AND MANUFACTURING METHOD THEREFOR, AND DISPLAY DEVICE

CROSS-REFERENCE TO RELATED APPLICATIONS

The present application is a U.S. National Phase Entry of International Application PCT/CN2021/104490 having an international filing date of Jul. 5, 2021, which claims priority and benefits of the patent application No. 202010796982.5 filed to the CNIPA on Aug. 10, 2020, and the contents disclosed in the above-mentioned applications are hereby incorporated as a part of this application.

TECHNICAL FIELD

The present disclosure relates to the field of display technology, and particularly relates to an organic light emitting display panel and a method for manufacturing the organic light emitting display panel, and a display device.

BACKGROUND

In organic light emitting display (OLED) products, due to their self-luminescence, an organic light emitting layer does not need a polarizer, but the contrast of the product is relatively low because of reflection of external light in the cathode layer, it is necessary to reduce the reflection of external light by a circular polarizer. Circular polarizer is composed of an ordinary polarizer and a ¼ wave plate. External light is first changed into linearly polarized light through polarizer, then changed into circularly polarized light through the ¼ wave plate, after reflection, the circularly polarized light is changed into linearly polarized light when passing through the ¼ wave plate for the second time, and its polarization direction is perpendicular to a polarization direction of incident linearly polarized light, thus reducing emission of reflected light.

A circular polarizer can reduce the reflection of external light and improve the outdoor contrast of an OLED product. However, circular polarizers have some problems, such as low transmittance, large thickness and poor folding. At present, COE (Color Filter on Encapsulation) process is used for improving the above problems of circular polarizer, that is, a color film process is carried out on the encapsulation layer to replace the circular polarizers in OLED products, and a filtering principle of color film is used for blocking the reflection of external light.

However, at present, the organic light emitting display panel manufactured by the COE process still needs to be improved.

SUMMARY

The present application is based on the inventor's discovery and understanding of the following facts and problems:

The inventor found that an organic light emitting display panel formed by the COE process has problems of color separation and color shift. This is mainly because a cathode has a non-flat region in a light emitting region of OLED: when the external light irradiates the non-flat region of the cathode, the non-flat region will cause the external light to reflect in the light emitting region, and the reflected light will not be parallel, that is, reflected red, green and blue light rays cannot be reflected in the same direction, resulting in color separation and color shift. For example, referring to FIG. 5, external light is incident at an angle of −45 degrees, a cathode of an organic light emitting element 200 is irradiated through a color block of the color film layer 400. When the incident light is irradiated to a non-flat part of the cathode (as shown in FIG. 5), the red light (R light), the green light (G light) and the blue light (B light) emitted are reflected by the cathode and have different reflection directions. A non-white light formed by combination of the R light and the G light is observed in the A region, and B light (i.e., also non-white light) is observed in the B region. During displaying of the organic light emitting display panel (i.e. when the organic light emitting element emits light), the above non-white light will be mixed with the light emitted by the organic light emitting element, resulting in a color shift phenomenon. When the organic light emitting display panel does not display (i.e. when the organic light emitting element does not emit light), human eyes can observe the non-white light, resulting in a color separation phenomenon. In addition, compared with circular polarizers, the reflectivity of color film layer is higher, which can not meet the requirements, resulting in lower contrast of the organic light emitting display panel.

At present, there are solutions to improve cathode flatness by increasing a thickness of a planarization layer on a back plate. Although this solution has some improvement on the color separation phenomenon and the color shift phenomenon, its improvement effect is limited, and the color separation and color shift are still not up to standard, and this solution cannot reduce the reflectivity of external light. Therefore, it is urgent to develop new solutions to improve the color separation, color shift and high reflectivity of organic light emitting display panels.

The present application aims at alleviating or solving at least one of the above mentioned problems to at least some extent.

In one aspect of the present application, the present application provides an organic light emitting display panel. The organic light emitting display panel includes: a substrate, organic light emitting elements and an encapsulation layer, wherein the encapsulation layer and the substrate define a closed space, the organic light emitting elements are disposed in the closed space, an organic light emitting element includes an anode, an organic light emitting layer and a cathode which are sequentially stacked along a direction away from the substrate, a first protrusion is provided at a side of the organic light emitting layer away from the substrate, and a portion of the cathode covering the first protrusion forms a second protrusion; a color film layer, which is disposed on a side of the encapsulation layer away from the organic light emitting element, the color film layer includes color blocks and a black matrices, wherein the color blocks are arranged in one-to-one correspondence with the organic light emitting elements, and there is an overlapping region between an orthographic projection of the black matrices on the substrate and an orthographic projection of the second protrusion on the substrate. Therefore, the color separation phenomenon and color shift phenomenon of the organic light emitting display panel can be effectively improved, the reflectivity of external light can be reduced, and the display quality and contrast of the organic light emitting display panel when irradiated by external light can be improved.

Further, the black matrix has a first part and a second part, the organic light emitting element has a light emitting region, an orthographic projection of the first part on the substrate covers a region other than an orthographic projection of the light emitting region on the substrate, and an orthographic projection of the second part on the substrate is within the orthographic projection of the light emitting region on the substrate and covers at least a portion of the orthographic projection of the second protrusion on the substrate.

Further, the orthographic projection of the second part on the substrate overlaps with the orthographic projection of the second protrusion on the substrate.

Further, the orthographic projection of the second protrusion on the substrate is within the orthographic projection of the second part on the substrate, and an area of the orthographic projection of the second part is larger than an area of the orthographic projection of the second protrusion.

Further, the anode includes a strip electrode, and a portion of the organic light emitting layer covering the strip electrode forms the first protrusion.

Further, the organic light emitting element includes a red organic light emitting element, a green organic light emitting element and a blue organic light emitting element, and a color of light emitted through a color block is the same as a color of light of an organic light emitting element corresponding to the color block.

Further, reflectivity of external light incident on the organic light emitting display panel is less than 5.5%.

In another aspect of the present application, the present application provides a method for manufacturing an organic light emitting display panel. The method includes: forming organic light emitting elements and an encapsulation layer packaging the organic light emitting elements on a substrate, wherein an organic light emitting element includes an anode, an organic light emitting layer and a cathode which are stacked in sequence along a direction away from the substrate, a first protrusion is provided at a side of the organic light emitting layer away from the substrate, and a portion of the cathode covering the first protrusion forms a second protrusion; and forming a color film layer on a side of the encapsulation layer away from the organic light emitting elements, wherein the color film layer includes color blocks and black matrices, wherein the color blocks are arranged in one-to-one correspondence with the organic light emitting elements, and there is an overlapping region between an orthographic projection of a black matrix on the substrate and an orthographic projection of the second protrusion on the substrate. Therefore, the color separation phenomenon and color shift phenomenon of the organic light emitting display panel can be effectively improved, the reflectivity of external light can be reduced, and the display quality and contrast of the organic light emitting display panel when irradiated by external light can be improved.

Further, the black matrix is formed by: forming a black matrix material layer on the side of the encapsulation layer away from the organic light emitting elements; and based on a mask having a predetermined shape, patterning the black matrix material layer to form the black matrix having a first part and a second part, wherein an organic light emitting element has a light emitting region, so that an orthographic projection of the first part on the substrate covers a region other than an orthographic projection of the light emitting region on the substrate, and so that an orthographic projection of the second part on the substrate is within the orthographic projection of the light emitting region on the substrate and covers at least a portion of the orthographic projection of the second protrusion on the substrate.

Further, by adjusting an opening of the mask plate, the orthographic projection of the second part on the substrate overlaps with the orthographic projection of the second protrusion on the substrate.

Further, by adjusting an opening of the mask plate, the orthographic projection of the second part on the substrate covers the orthographic projection of the second protrusion on the substrate, and an area of the orthographic projection of the second part is larger than an area of the orthographic projection of the second protrusion.

Further, forming the anode includes forming a strip electrode on the substrate, and the first protrusion is formed by the organic light emitting layer at the strip electrode.

In another aspect of the present application, the present application provides a display device. The display device includes the above-described organic light emitting display panel, whereby the display device has all the features and advantages of the above-described organic light emitting display panel, which will not be repeated here. In general, the display device has good display quality and high contrast when irradiated by external light.

BRIEF DESCRIPTION OF DRAWINGS

The above mentioned and/or additional aspects and advantages of the present application will become apparent and easily understandable from the following description of embodiments in conjunction with accompanying drawings.

REFERENCE NUMBERS

Figure 1:
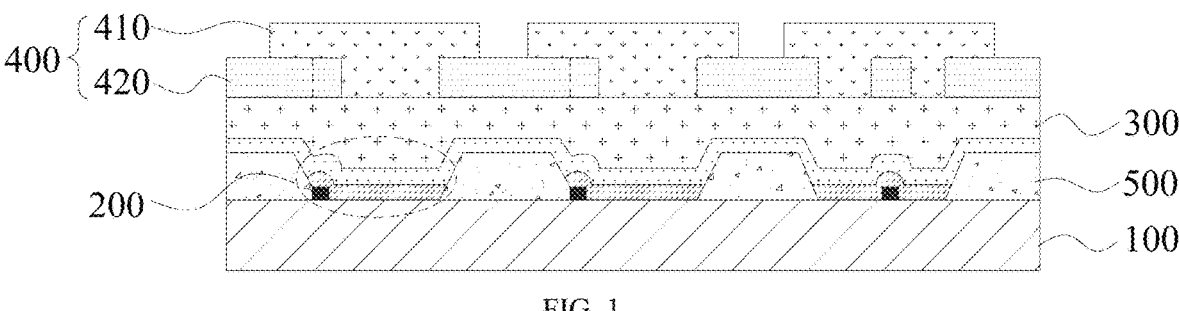
FIG. 1 shows a schematic diagram of a structure of an organic light emitting display panel according to an embodiment of the present application.

100: substrate; 200: organic light emitting element; 210: anode; 220: organic light emitting layer; 230: cathode; 300: encapsulation layer; 400: color film layer; 410: color block; 420: black matrix; 421: first part; 422: second part; 10: the first protrusion; 20: the second protrusion; 30: light emitting region; 500: pixel define layer.

DETAILED DESCRIPTION

Descriptions will now be made in detail to embodiments, illustrations of which are shown in the accompanying drawings. The same or similar, or functionally same or similar elements are indicated by like reference numerals throughout the descriptions. The embodiments described herein with reference to the accompanying drawings are exemplary, used for explaining the present disclosure only, and should not be construed as limitations on the present application.

In one aspect of the present application, the present application provides an organic light emitting display panel.

Figure 2:
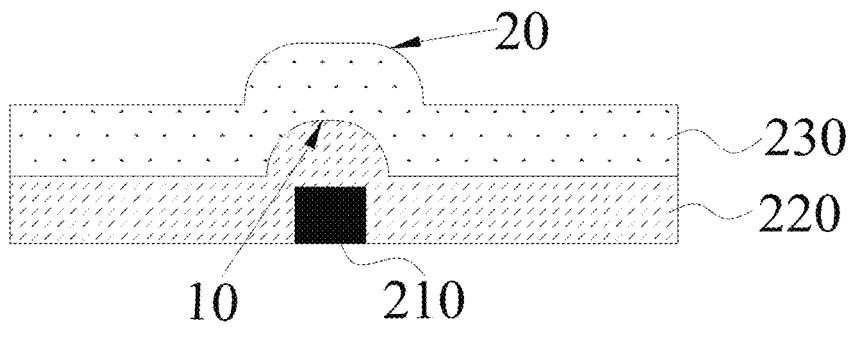
FIG. 2 shows a schematic diagram of a structure of an organic light emitting element according to an embodiment of the present application.
Figure 3:
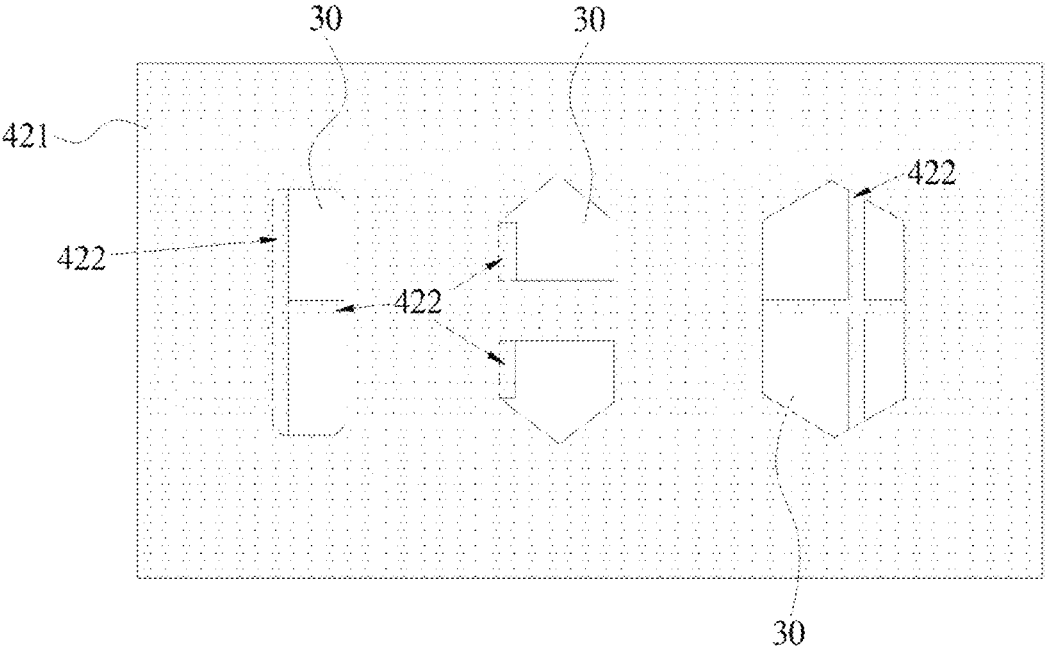
FIG. 3 shows a schematic top view of a black matrix according to an embodiment of the present application.

According to an embodiment of the present application, referring to FIGS. 1-3, the organic light emitting display panel includes: a substrate 100, an organic light emitting element 200, an encapsulation layer 300 and a color film layer 400. Among them, a closed space is defined by the encapsulation layer 300 and the substrate 100, the organic light emitting element 200 is disposed in the above-mentioned closed space (refer to FIG. 1). The organic light emitting element 200 includes an anode 210, an organic light emitting layer 220, and a cathode 230 that are stacked in sequence in a direction away from the substrate 100. A side of the organic light emitting layer 220 away from the substrate 100 has a first protrusion 10, a portion of the cathode 230 covering the first protrusion 10 forms a second protrusion 20 (refer to FIG. 2). A color film layer 400 is disposed on a side of the encapsulation layer 300 away from the organic light emitting element 200. The color film layer 400 includes a color block 410 and a black matrix 420, wherein the color block 410 is provided in one-to-one correspondence with the organic light emitting element 200, and there is an overlapping region between an orthographic projection of the black matrix 420 on the substrate 100 and an orthographic projection of the second protrusion 20 on the substrate 100 (referring to FIGS. 1 and 3, the overlapping region between the orthographic projection of the black matrix and the orthographic projection of the second protrusion is the region marked 422 in FIG. 3 (the region indicated by dashed lines)). Therefore, the color separation phenomenon and color shift phenomenon of the organic light emitting display panel can be effectively improved, the reflectivity of external light can be reduced, and the display quality and contrast of the organic light emitting display panel when irradiated by external light can be improved.

It should be noted that "one-to-one correspondence between color block and organic light emitting element" means that one color block corresponds to one organic light emitting element and one organic light emitting element corresponds to one color block.

According to the embodiment of the present application, the organic light emitting layer has the first protrusion on the side away from the substrate, and the cathode covers the organic light emitting layer so that the portion of the cathode covering the first protrusion forms the second protrusion, the second protrusion is a non-flat region of the cathode, and a portion of the cathode other than the second protrusion is a planarization region of the cathode.

In the present application, with the improvement on the black matrix in the color film layer, specifically, there is an overlapping region between the orthographic projection of the black matrix on the substrate and the orthographic projection of the second protrusion of the cathode on the substrate, that is, the black matrix is used for blocking the non-flat region of the cathode, thereby reducing incidence of external light at the non-flat region of the cathode, and reducing the emission of reflected light at the non-flat region of the cathode. In other words, as far as possible, only the light reflected by the planarization region of the cathode is emitted, and reflection angles of the light rays reflected by the planarization region of the cathode are relatively close, that is, the light emitted by color blocks of different colors can be emitted in parallel, so that the reflected light of various colors can be combined into white light, the problems of color separation and color shift are alleviated, and display quality of the organic light emitting display panel is improved. At the same time, because there is the overlapping region between the orthographic projection of the black matrix on the substrate and the orthographic projection of the second protrusion on the substrate, the incidence of external light at the non-flat region of the cathode and the emission of reflected light at the non-flat region of the cathode can be reduced, thereby reducing the reflectivity of external light and improving the contrast of the organic light emitting display panel.

A specific constituent material of the cathode is not particularly limited, and a person skilled in the art can design the cathode according to commonly used material of OLED elements. For example, the cathode may be formed of a metal material.

As will be appreciate by those skilled in that art, the organic light emitting display panel further includes a pixel define layer 500 (refer to FIG. 1), In a manufacturing process, the anode 210 is formed first, then the pixel define layer 500 is formed, then the organic light emitting layer 220 is formed between two adjacent pixel define layers 500, and finally the cathode 230 covering the organic light emitting layer 220 and the pixel define layer 500 is formed. The pixel define layer is used for preventing occurrence of color crosstalk and color mixing phenomena between two adjacent OLED elements.

Each structure of the organic light emitting display panel will be described in detail below according to specific embodiments of the present application:

According to an embodiment of the present application, referring to FIG. 3, the black matrix 420 has a first part 421 and a second part 422, the organic light emitting element has a light emitting region 30 (the light emitting region 30 is a region formed by a hollowed-out region of the black matrix in FIG. 3 and a region of the marker 422). An orthographic projection of the first part 421 on the substrate covers a region other than an orthographic projection of the light emitting region 30 on the substrate, and an orthographic projection of the second part 422 on the substrate is within an orthographic projection of the light emitting region 30 on the substrate and covers at least a portion of the orthographic projection of the second protrusion 20 on the substrate (the second protrusion is not shown in FIG. 3). Therefore, the color separation phenomenon and the color shift phenomenon of the organic light emitting display panel can be effectively improved, the display of the organic light emitting display panel is not affected, the reflectivity of external light is reduced, and the contrast of the organic light emitting display panel is improved.

According to some other embodiments of the present application, the orthographic projection of the second part 422 on the substrate may also overlap with the orthographic projection of the second protrusion 20 on the substrate, i.e. the second part completely covers the second protrusion. Therefore, the incidence of external light at the non-flat region of the cathode and the emission of reflected light at the non-flat region of the cathode can be further reduced, the color separation phenomenon and color shift phenomenon of the organic light emitting display panel can be further improved, the reflectivity of external light can be further reduced, and the display quality and contrast of the organic light emitting display panel can be improved.

According to some other embodiments of the present application, the orthographic projection of the second protrusion 20 on the substrate is within an orthographic projection of the second part 422 on the substrate, and an area of the orthographic projection of the second part 422 is larger than an area of the orthographic projection of the second protrusion 20. That is to say, on the basis that the second part completely covers the second protrusion, the second part can be made slightly larger to block more regions of the light emitting region, thereby further improving the color separation phenomenon and color shift phenomenon of the organic light emitting display panel, further reducing the reflectivity of external light, and improving the display quality and contrast of the organic light emitting display panel.

It should be noted that, because the orthographic projection of the second part on the substrate is within the orthographic projection of the light emitting region on the substrate, therefore, in this embodiment, if the area of the orthographic projection of the second part is too large compared with the area of the orthographic projection of the second protrusion, it will significantly reduce an aperture ratio of the organic light emitting element and affect the display effect. Therefore, when designing the second part, on the basis of ensuring that the color separation phenomenon and color shift phenomenon of the organic light emitting display panel can be improved, it should also ensure that the organic light emitting element has an appropriate aperture ratio to ensure the display effect of the organic light emitting display panel. The specific difference between the areas of the orthographic projections of the second part and the second protrusion is not limited herein, and a person skilled in the art can design according to the actual situation on the basis of satisfying the two conditions described above.

Figure 4:
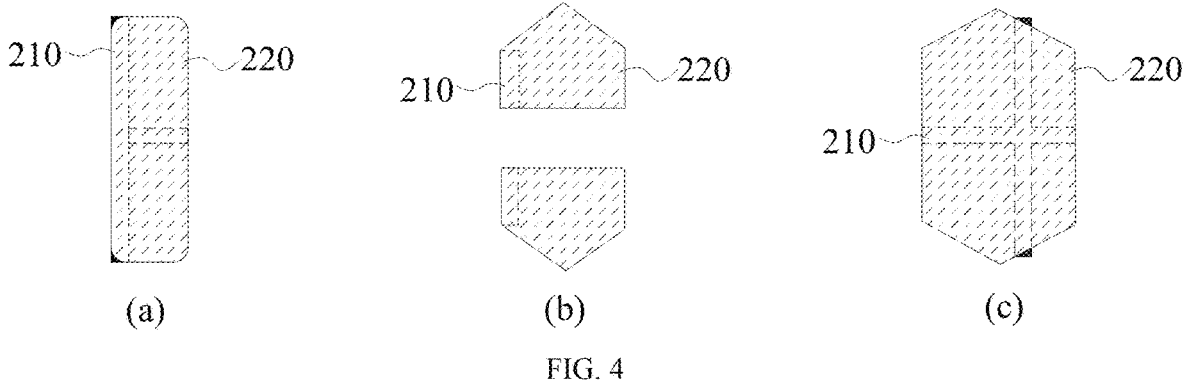
FIG. 4 shows a schematic top view of an organic light emitting layer and an anode according to an embodiment of the present application.
Figure 5:
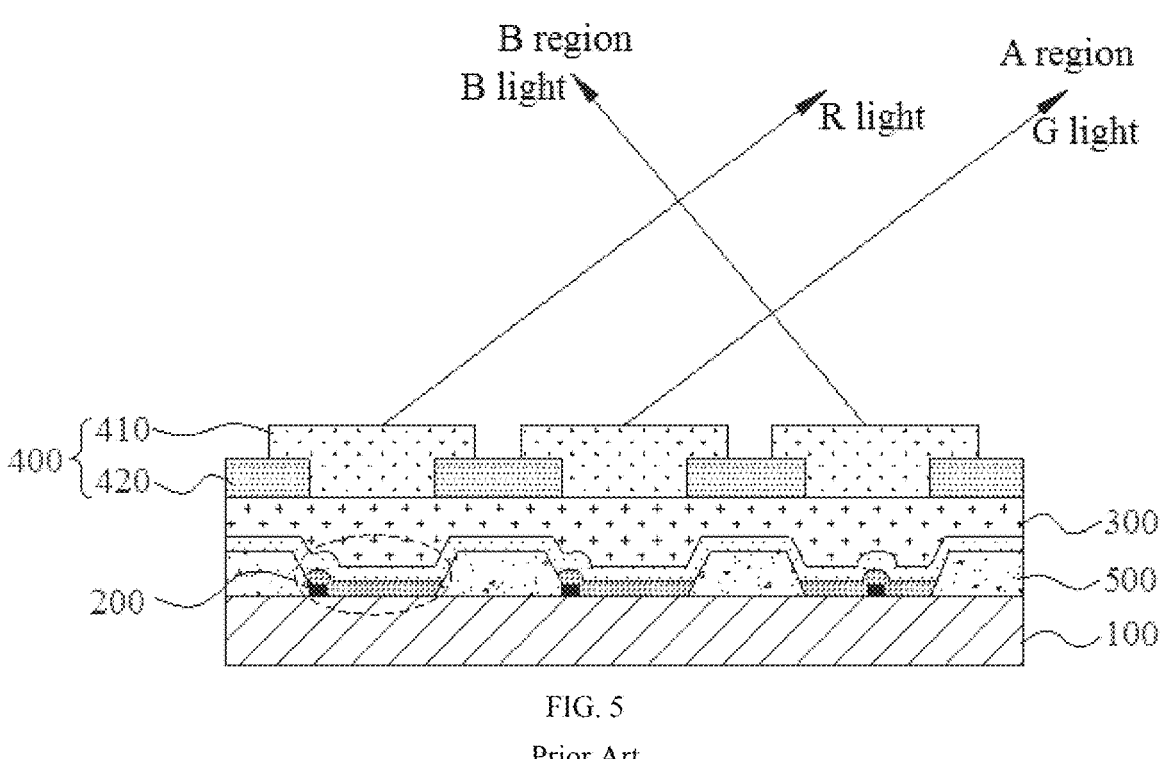
FIG. 5 shows a schematic diagram of color separation and color shift in a conventional organic light emitting display panel irradiated by external light.

According to an embodiment of the present application, with reference to FIG. 4, in an organic light emitting element, the anode 210 may include a strip electrode and a portion of the organic light emitting layer 220 covering the strip electrode forms the first protrusion 10. Because the anode is a strip electrode, and the strip electrode has a certain height, therefore, the portion of the organic light emitting layer covering the strip electrode is higher than a portion of the organic light emitting layer not covering the strip electrode by a certain height, so that the first protrusion is formed by the organic light emitting layer at the strip electrode, the first protrusion is a non-flat region of the organic light emitting layer, and a portion of the organic light emitting layer other than the first protrusion is a planarization region. The cathode is covered by the organic light emitting layer, so that a portion of the cathode covering the first protrusion forms the second protrusion, forming a non-flat region of the cathode, i.e. the non-flat region of the cathode is caused by the anode. In the present application, the non-flat region caused by the anode is shielded by the black matrix, which can effectively alleviate the problems of color separation and color shift of the organic light emitting display panel, simultaneously reduce the reflectivity of external light, and improve the display quality and contrast of the organic light emitting display panel.

According to an embodiment of the present application, strip electrodes are irregularly arranged on the substrate, therefore, non-flat regions of the cathode are also irregularly distributed. In the present application, with improvement on the black matrix, the black matrix shields the non-flat regions, which can simply and effectively alleviate color separation and color shift, and can reduce the reflectivity of external light.

According to an embodiment of the present application, organic light emitting elements may include a red organic light emitting element, a green organic light emitting element, and a blue organic light emitting element, and the color of light emitted through a color block is the same as the color of light emitted by an organic light emitting element corresponding to the color block. That is, the color blocks include a red color block, a green color block and a blue color block, and the red color block is arranged corresponding to the red organic light emitting element, the green color block is arranged corresponding to the green organic light emitting element, and the blue color block is arranged corresponding to the blue organic light emitting element. Therefore, red light emitted by the red organic light emitting element can be emitted through the red color block, green light emitted by the green organic light emitting element can be emitted through the green color block, and blue light emitted by the blue organic light emitting element can be emitted through the blue color block, so that the organic light emitting display panel has a good display effect.

According to an embodiment of the present application, referring to (a) in FIG. 4, the organic light emitting layer 220 is formed of an organic material emitting red light, and the anode 210 is disposed at an edge of the organic light emitting layer 220 and at an intermediate position. Referring to (b) in FIG. 4, the organic light emitting layer 220 is formed of an organic material emitting green light and an anode 210 is provided at an edge of the organic light emitting layer 220. Referring to (c) in FIG. 4, the organic light emitting layer 220 is formed of an organic material emitting blue light, and the anode 210 is arranged in a "cross" shape within the region where the organic light emitting layer 220 is located. It should be noted that, since the anode is located under the organic light emitting layer, the dashed line region in FIG. 4 is a region corresponding to the organic light emitting layer and the anode, that is, a position of the anode.

Figure 6:
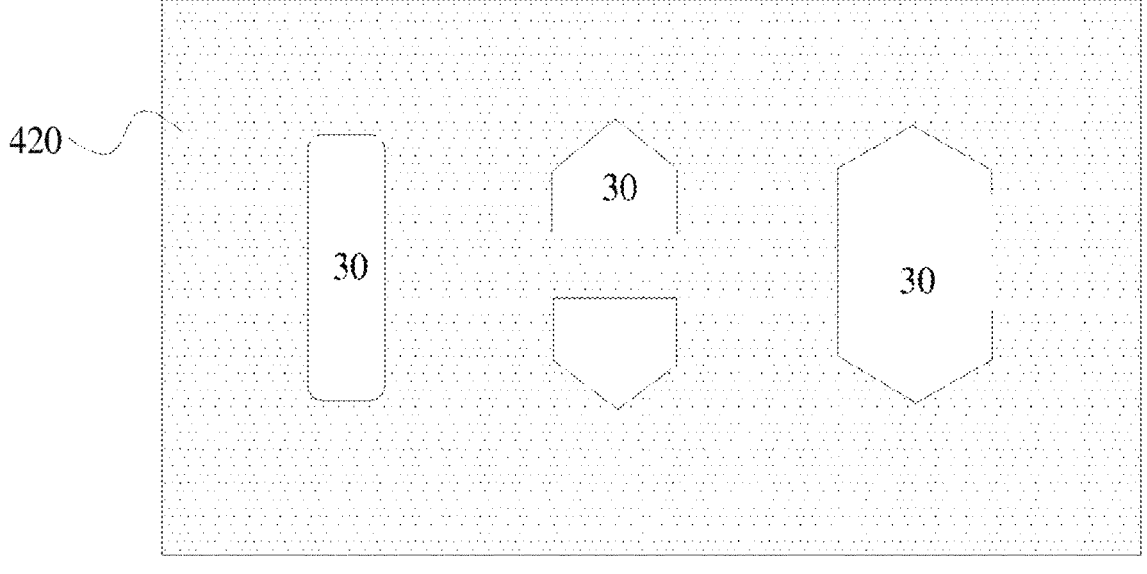
FIG. 6 shows a schematic top view of a black matrix in a conventional organic light emitting display panel.

Referring to FIG. 6, FIG. 6 is a schematic plan view of a black matrix and an organic light emitting element in a conventional organic light emitting display panel, the black matrix 420 only shields a region other than the light emitting region 30, so that when external light irradiates the non-flat region of the cathode, the organic light emitting display panel has problems of color separation and color shift, and the reflectivity of external light is also high. Referring to FIG. 3, the black matrix of the present application not only shields regions other than the light emitting region 30, but also shields the non-flat region of the cathode. Therefore, the incidence of external light at the non-flat region of the cathode can be reduced, thereby reducing the emission of reflected light at the non-flat region of the cathode. Therefore, the color separation phenomenon and the color shift phenomenon of the organic light emitting display panel can be effectively alleviated, and the display quality of the organic light emitting display panel is improved. Compared with the conventional black matrix, the opening region of the black matrix of the invention is reduced to a certain extent, so that the reflectivity of external light can be reduced and the contrast of the organic light emitting display panel can be improved.

According to the embodiment of the present application, the black matrix 420 can make the reflectivity of the external light incident on the organic light emitting display panel less than 5.5%, so that the anti-reflection effect equivalent to that of the circular polarizer can be achieved, and the organic light emitting display panel still has a high contrast when irradiated by the external light.

In another aspect of the present application, the present application proposes a method for manufacturing an organic light emitting display panel. According to the embodiment of the present application, the organic light emitting display panel manufactured by the method may be the organic light emitting display panel described above, whereby the organic light emitting display panel produced by the method may have the same features and advantages as the organic light emitting display panel described above, and will not be described herein.

Figure 7:
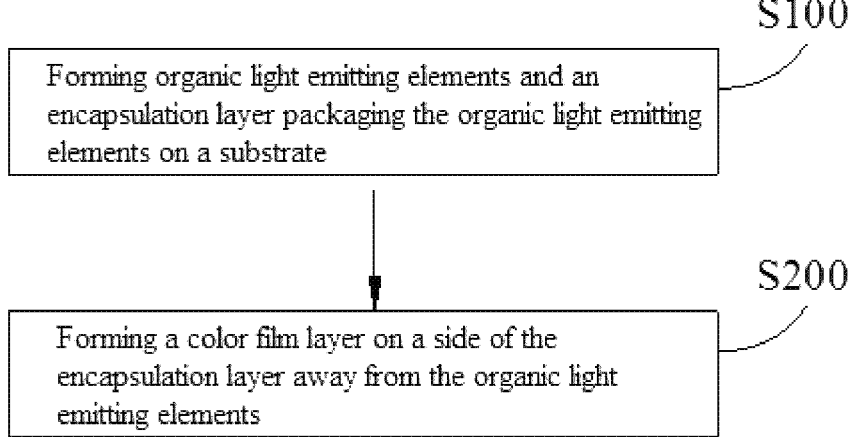
FIG. 7 shows a schematic flowchart of a method for manufacturing an organic light emitting display panel according to an embodiment of the present application.

According to an embodiment of the present application, referring to FIG. 7, the method includes:

S100: forming an organic light emitting element and an encapsulation layer packaging the organic light emitting element on a substrate According to an embodiment of the present application, in this step, an organic light emitting element and an encapsulation layer packaging the organic light emitting element are formed on a substrate. According to the embodiment of the present application, the organic light emitting element includes an anode, an organic light emitting layer, and a cathode that are stacked in sequence in a direction away from the substrate. The side of the organic light emitting layer away from the substrate has a first protrusion, and a portion of the cathode covering the first protrusion forms a second protrusion. The specific manufacturing processes of the anode, the organic light emitting layer and the cathode are not particularly limited, and the person skilled in the art can design according to the common manufacturing process of the above-mentioned structures.

According to an embodiment of the present application, forming the anode may include forming a strip electrode on the substrate, and because the strip electrode has a certain height, when the organic light emitting layer is formed, a portion of the organic light emitting layer covering the strip electrode form a first protrusion, so that the cathode formed subsequently forms a second protrusion at the first protrusion. The second protrusion is a non-flat region of the cathode, and a portion of the cathode other than the second protrusion is a planarization region, that is, the non-flat region of the cathode is caused by the anode. When external light irradiates the non-flat region of the cathode, color separation and color shift will appear on the organic light emitting display panel, which affects the display of the organic light emitting display panel. A color film layer is formed on a side of the encapsulation layer away from the organic light emitting element in a subsequent step of the present application. The black matrix in the color film shields the non-flat region of the cathode, which can effectively improve the color separation and color shift of the organic light emitting display panel, and reduce the reflectivity of external light, thus improving the display quality and contrast of the organic light emitting display panel.

Arrangement of anodes has been described in detail before, so it will not be repeated here.

Specific structure and manufacturing process of the encapsulation layer are not particularly limited, and can be designed by those skilled in the art according to specific conditions.

S200: forming a color film layer on a side of the encapsulation layer away from the organic light emitting element According to an embodiment of the present application, in this step, a color film layer is formed on a side of the encapsulation layer away from the organic light emitting element. According to the embodiment of the present application, the color film layer includes a color block and a black matrix, the color block is arranged in one-to-one correspondence with the organic light emitting element, wherein there is an overlapping region between an orthographic projection of the black matrix on the substrate and an orthographic projection of the second protrusion of the cathode on the substrate. That is, the present application improves the black matrix in the color film layer, so as to make the black matrix block the non-flat region of the cathode, thereby reducing incidence of external light at the non-flat region of the cathode, and reducing emission of reflected light at the non-flat region of the cathode. As far as possible, only the light reflected by the planarization region of the cathode is emitted, and reflection angles of light rays reflected by the planarization region of cathode are relatively close. That is, the light rays emitted by color blocks of different colors can be emitted in parallel, so that the reflected light of various colors can be combined into white light, thus effectively improving the color separation phenomenon and color shift phenomenon of the organic light emitting display panel, reducing the reflectivity of external light and improving the display quality and contrast of the organic light emitting display panel.

According to the embodiment of the present application, the black matrix may be formed by first forming a black matrix material layer on the side of the encapsulation layer away from the organic light emitting element. Then, based on a mask having a predetermined shape, the black matrix material layer is patterned to form a black matrix having a first part and a second part, wherein an orthographic projection of first part on the substrate covers a region other than an orthographic projection of the light emitting region on the substrate, and an orthographic projection of the second part on the substrate is within the orthographic projection of the light emitting region on the substrate and covers at least a portion of an orthographic projection of the cathode on the substrate. Therefore, the incidence of external light at the non-flat cathode and the emission of reflected light at the non-flat cathode can be reduced, the color separation phenomenon and color shift phenomenon of the organic light emitting display panel can be improved, the reflectivity of external light can be reduced, and the display quality and contrast of the organic light emitting display panel can be improved.

According to some other embodiments of the present application, it is also possible to adjust the opening of the mask plate so that the orthographic projection of the formed second part on the substrate overlaps with an orthographic projection of the second protrusion of the cathode on the substrate. That is, an shielding area of the black matrix to the non-flat region of the cathode is increased, further reduce the incidence of external light at the non-flat cathode and the emission of reflected light at the non-flat cathode, further improve the color separation and color shift phenomenon of the organic light emitting display panel, further reduce the reflectivity of external light, and improve the display quality and contrast of the organic light emitting display panel.

According to some other embodiments of the present application, it is also possible to adjust the opening of the mask plate so that the orthographic projection of the formed second part on the substrate covers the orthographic projection of the second protrusion of the cathode on the substrate, and an area of the orthographic projection of the second part is larger than an area of the orthographic projection of the second protrusion. Therefore, the color separation and the color shift of the organic light emitting display panel can be further improved, the reflectivity of external light can be further reduced, and the display quality and contrast of the organic light emitting display panel can be improved. It should be noted that, in this embodiment, when the area of the second part is increased, it is necessary to ensure that the organic light emitting element has an appropriate aperture ratio on the basis of ensuring that the color separation and color shift of the organic light emitting display panel can be improved, so that the display effect of the organic light emitting display panel is ensured.

In another aspect of the present application, the present application provides a display device. According to an embodiment of the present application, the display device includes the organic light emitting display panel described above. Thus the display device has all the features and advantages of the organic light emitting display panel described above and will not be repeated here. In general, the display device has good display quality and high contrast when irradiated by external light.

In the description of this application, the orientation or positional relationship indicated by the terms "upper", "lower", etc. is based on the orientation or positional relationship shown in the accompanying drawings, and is only for the convenience of describing the present application rather than requiring that the present application must be constructed and operated in a specific orientation, Therefore, it should not be construed as a limitation on this application.

Reference throughout this specification to "an embodiment" and "another embodiment" means that a particular feature, structure, material, or characteristic described in connection with the embodiment is included in at least one embodiment of the present disclosure. In this description, the schematic expression of the above terms does not necessarily refer to the same embodiment or example. Moreover, the specific feature, structure, material, or characteristic described may be combined in a proper way in any one or more embodiments or examples. In addition, without a conflict, a person skilled in the art may combine different embodiments or examples described in this description and the features of different embodiments or examples. In addition, it should be noted that in the present description, terms "first" and "second" are only used for description and should not be construed as indicating or implying relative importance or implicitly indicating the number of indicated technical features.

Although the embodiments of the present application have been shown and described above, it should be understood that the above embodiments are exemplary, and will not be understood as the limitation to the present application. Alterations, modifications, substitutions and variations to the above embodiments may be made by those skilled in the art within the scope of the present application.

The invention claimed is:

1. An organic light emitting display panel comprising:
a substrate, organic light emitting elements and an encapsulation layer, wherein the encapsulation layer and the substrate define a closed space, the organic light emitting elements are disposed in the closed space, an organic light emitting element comprises an anode, an organic light emitting layer and a cathode which are sequentially stacked along a direction away from the substrate, a first protrusion is provided at a side of the organic light emitting layer away from the substrate, and a portion of the cathode covering the first protrusion forms a second protrusion; and
a color film layer, which is disposed on a side of the encapsulation layer away from the organic light emitting elements, the color film layer comprises color blocks and black matrices, wherein the color blocks are arranged in one-to-one correspondence with the organic light emitting elements, and there is an overlapping region between an orthographic projection of the black matrices on the substrate and an orthographic projection of the second protrusion on the substrate;
wherein the second protrusion is a non-flat region of the cathode, and a portion of the cathode other than the second protrusion is a planarization region of the cathode, the black matrix is configured to block the non-flat region of the cathode;
wherein the black matrix has a first part and a second part, the organic light emitting element has a light emitting region, an orthographic projection of the first part on the substrate covers a region other than an orthographic projection of the light emitting region on the substrate, and an orthographic projection of the second part on the substrate is within the orthographic projection of the light emitting region on the substrate and covers at least a portion of the orthographic projection of the second protrusion on the substrate;
wherein the orthographic projection of the second protrusion on the substrate is within the orthographic projection of the second part on the substrate, and an area of the orthographic projection of the second part is larger than an area of the orthographic projection of the second protrusion.

2. The organic light emitting display panel according to claim 1, wherein the anode comprises a strip electrode, and a portion of the organic light emitting layer covering the strip electrode forms the first protrusion.

3. The organic light emitting display panel according to claim 1, wherein the organic light emitting elements comprise a red organic light emitting element, a green organic light emitting element and a blue organic light emitting element, and a color of light emitted through a color block is the same as a color of light of an organic light emitting element corresponding to the color block.

4. The organic light emitting display panel according to claim 1, wherein reflectivity of external light incident on the organic light emitting display panel is less than 5.5%.

5. A display device, comprising the organic light emitting display panel according to claim 1.

6. The organic light emitting display panel according to claim 2, wherein the organic light emitting elements comprise a red organic light emitting element, a green organic light emitting element and a blue organic light emitting element, and a color of light emitted through a color block is the same as a color of light of an organic light emitting element corresponding to the color block.

7. A method for manufacturing an organic light emitting display panel, comprising:
forming organic light emitting elements and an encapsulation layer packaging the organic light emitting elements on a substrate, wherein an organic light emitting element comprises an anode, an organic light emitting layer and a cathode which are stacked in sequence along a direction away from the substrate, a first protrusion is provided at a side of the organic light emitting layer away from the substrate, and a portion of the cathode covering the first protrusion forms a second protrusion; and
forming a color film layer on a side of the encapsulation layer away from the organic light emitting elements, wherein the color film layer comprises color blocks and black matrices, wherein the color blocks are arranged in one-to-one correspondence with the organic light emitting elements, and there is an overlapping region between an orthographic projection of a black matrix on the substrate and an orthographic projection of the second protrusion on the substrate;
wherein the second protrusion is a non-flat region of the cathode, and a portion of the cathode other than the second protrusion is a planarization region of the cathode, the black matrix is configured to block the non-flat region of the cathode;

wherein the black matrix is formed by:

forming a black matrix material layer on the side of the encapsulation layer away from the organic light emitting elements;

based on a mask having a predetermined shape, patterning the black matrix material layer to form the black matrix having a first part and a second part, wherein an organic light emitting element has a light emitting region, so that an orthographic projection of the first part on the substrate covers a region other than an orthographic projection of the light emitting region on the substrate, and so that an orthographic projection of the second part on the substrate is within the orthographic projection of the light emitting region on the substrate and covers at least a portion of an orthographic projection of the second protrusion on the substrate;

by adjusting an opening of the mask plate, the orthographic projection of the second part on the substrate covers the orthographic projection of the second protrusion on the substrate, and an area of the orthographic projection of the second part is larger than an area of the orthographic projection of the second protrusion.

8. The method according to claim 7, wherein forming the anode comprises forming a strip electrode on the substrate, and the first protrusion is formed by the organic light emitting layer at the strip electrode.

\*   \*   \*   \*   \*